(12) United States Patent
Yasuno et al.

(10) Patent No.: US 6,727,456 B2
(45) Date of Patent: Apr. 27, 2004

(54) DEPOSITED FILM FORMING METHOD AND DEPOSITED FILM FORMING APPARATUS

(75) Inventors: Atsushi Yasuno, Nara (JP); Hiroshi Izawa, Kyoto (JP); Masatoshi Tanaka, Kyoto (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/153,721

(22) Filed: May 24, 2002

(65) Prior Publication Data

US 2003/0006218 A1 Jan. 9, 2003

(30) Foreign Application Priority Data

May 31, 2001 (JP) ........................................ 2001-164786

(51) Int. Cl.[7] ................................................ B23K 9/00
(52) U.S. Cl. .................. 219/121.47; 219/686
(58) Field of Search ................. 428/450; 427/575; 136/249, 258; 257/458; 118/718, 719, 723 E, 723 MW, 723 R; 219/121.11, 121.36, 121.47, 121.51, 121.58, 679, 680, 686, 752, 754

(56) References Cited

U.S. PATENT DOCUMENTS

| 4,400,409 | A | | 8/1983 | Izu et al. ........................ 427/39 |
|---|---|---|---|---|
| 4,462,333 | A | | 7/1984 | Nath et al. ................... 118/723 |
| 4,759,993 | A | * | 7/1988 | Pai et al. ..................... 428/450 |
| 5,589,007 | A | * | 12/1996 | Fujioka et al. .............. 136/249 |
| 6,273,955 | B1 | | 8/2001 | Yoshino et al. ............. 118/718 |
| 6,338,872 | B1 | | 1/2002 | Yoshino et al. .......... 427/248.1 |
| 6,350,489 | B1 | | 2/2002 | Moriyama et al. ....... 427/255.5 |

FOREIGN PATENT DOCUMENTS

| JP | 9-162133 | 6/1997 |
|---|---|---|
| JP | 2000-160345 | 6/2000 |

* cited by examiner

*Primary Examiner*—Tu Ba Hoang
(74) *Attorney, Agent, or Firm*—Fitzpatrick, Cella, Harper & Scinto

(57) ABSTRACT

A deposited film forming method and apparatus includes a belt-like member continuously conveyed through a film-forming chamber, one side of which is formed of the belt-like member. A reactive gas is introduced into the film-forming chamber, the interior of the film-forming chamber is evacuated, a high-frequency power induces a plasma therein, and a deposited film is formed on the belt-like member A discharge confining means is provided opposite to a deposited film forming side of the belt-like member to maintain constant contact with the belt-like member while it changes shape.

10 Claims, 4 Drawing Sheets

DEPOSITED FILM FORMING METHOD AND DEPOSITED FILM FORMING APPARATUS

BACKGROUND OF THE INVENTION

1. Field of the Invention

The present invention relates to a deposited film forming method and a deposited film forming apparatus and, more particularly, to a functional-deposited-film forming method of forming a stack element on a belt-like member by a roll to roll system and an apparatus for carrying out the method.

2. Related Background Art

As a method of continuously forming a functional deposited film of a semiconductor or the like for use in a photovoltaic element or the like on a substrate, there is known a method wherein there are provided independent film-forming chambers for formation of various semiconductor layers, these film-forming chambers are coupled by a load lock system through a gate valve, and the substrate is successively moved through the film-forming chambers to form various semiconductor layers on the substrate. As a method for remarkably enhancing mass productivity, U.S. Pat. No. 4,400,409 discloses a continuous plasma CVD process employing the so-called roll to roll system. This process is described as using a long magnetic belt-like member as a substrate, in which the substrate is continuously conveyed in the longitudinal direction thereof while desired conductive semiconductor layers are deposited in a plurality of glow discharge regions, whereby elements with semiconductor junctions can be continuously formed.

U.S. Pat. No. 4,462,333 discloses a continuous plasma CVD process employing the roll to roll system, in which a deposited film is formed by the use of a double chamber system wherein a pair of top plates with an aperture cover the edges of a substrate. Japanese Patent Application Laid-Open No. 9-162133 describes an invention titled "continuous forming method and apparatus of functional deposited films" in which a semiconductor film is deposited by a plasma CVD process with means for preventing leakage and diffusion of a discharge and an activated gas. It is described that in this apparatus a belt-like member constitutes a member for partitioning an activation region, and a member provided widthwise outside the belt-like member, for partitioning off the activation region is kept in contact with a back surface opposite to a deposited film forming surface of the belt-like member to prevent leakage and diffusion of a discharge and an activated gas. Further, Japanese Patent Application Laid-Open No. 2000-160345 discloses an invention titled "functional-deposited-film forming method and forming apparatus therefor" in which a top plate is kept in contact with a belt-like member to keep the belt-like member well at the earth potential relative to high-frequency waves, thereby stabilizing a discharge.

In these methods of continuously forming a functional deposited film of a semiconductor or the like for use in a photovoltaic element or the like on a substrate, efforts have been made to enhance the photoelectric conversion efficiency, characteristic stability, or characteristic uniformity, or to reduce the production cost, or the like. In these methods, however, an attempt for increasing the conveyance speed of a belt-like member resulted in occurrence of unevenness of the surface of the belt-like member due to fine undulation at the edges in the width (cross) direction of the belt-like member, or a gap of the discharge space generated by the unevenness and the change thereof to which the shapes of surrounding components failed to correspond. This sometimes caused a leakage of the discharge to degrade the discharge stability and characteristic uniformity.

When a semiconductor thin film was formed on a belt-like member with application of a bias in addition to application of a high-frequency power, sparks were generated because of a change in the contact state of the belt-like member with surrounding components due to the fine undulation or unevenness of the edges in the width direction of the belt-like member, or the vibration of the belt-like member itself.

Further, the undulation and unevenness of the width-direction edges of the belt-like member will always vary in the longitudinal direction thereof as well and the mechanical property and shape of the belt-like member supplied from a substrate roll will vary from roll to roll when replacing the belt-like member. It was thus difficult to preliminarily set the conventional surrounding components so as to adapt to the variations.

The present invention has been accomplished to solve the problem in the prior art as described above, and an object of the present invention is, therefore, to provide a deposited film forming method and a deposited film forming apparatus capable of decreasing the discharge leakage and sparks and maintaining a stable discharge even during high-speed conveyance, with increase in the film-forming speed, with replacement of the roll, or the like and, particularly, to provide a functional-deposited-film forming method and a functional-deposited-film forming apparatus enabling formation of amorphous silicon films that are excellent in electrical and optical characteristics and that can increase the yield of elements in mass production.

In order to achieve the above object, the present invention provides a deposited film forming method and a deposited film forming apparatus configured as in (1) to (10) below.

(1) A deposited film forming method of, while continuously conveying a belt-like member in a longitudinal direction thereof, passing the belt-like member through a film-forming chamber, one side of which is formed of the belt-like member and which is located in a vacuum-sealable reaction vessel, introducing a reactive gas into the film-forming chamber, evacuating the interior of the film-forming chamber by evacuation means to maintain the interior of the film-forming chamber at a given pressure, introducing a high-frequency power into the film-forming chamber to induce a plasma, and forming a deposited film on the belt-like member passing through the film-forming chamber, wherein on a side opposite to a deposited film forming side of the belt-like member that forms the said one side of the film-forming chamber, there is provided discharge confining means always maintaining contact with the said opposite side of the belt-like member while following a change in shape of the belt-like member, whereby the deposited film is formed in a state of reduced discharge leakage and sparks in the film-forming chamber.

(2) The method according to above (1), wherein the discharge confining means is comprised of a member always maintaining contact with the said opposite side of the belt-like member by at least one of elasticity, pressure, gravity, and magnetism.

(3) The method according to above (2), wherein the member is of a store curtain shape, saw-tooth shape, spring shape, brush shape, roller shape, or hinge shape.

(4) The method according to any one of above (1) to (3), wherein the discharge confining means is electrically conductive.

(5) The method according to above (4), wherein the high-frequency power introduced into the film-forming chamber has a frequency of not less than 10 MHz nor more than 10 GHz.

(6) A deposited film forming apparatus comprising means for continuously conveying a substrate consisting of a belt-like member for formation of a deposited film, in a longitudinal direction thereof: a vacuum-sealable reaction vessel having therein a film-forming chamber, one side of which is constituted of the belt-like member; means for introducing a reactive gas into the film-forming chamber; means for introducing a high-frequency power from a high-frequency power supply into the film-forming chamber; and means for evacuating the interior of the film-forming chamber, wherein on a side opposite to a deposited film forming side of the belt-like member that forms said one side of the film-forming chamber, there is provided discharge confining means always maintaining contact with said opposite side of the belt-like member while following a change in shape of the belt-like member.

(7) The apparatus according to above (6), wherein the discharge confining means is comprised of a member always maintaining contact with the opposite side of the belt-like member by at least one of elasticity, pressure, gravity, and magnetism.

(8) The apparatus according to above (7), wherein the member is of a store curtain shape, saw-tooth shape, spring shape, brush shape, roller shape, or hinge shape.

(9) The apparatus according to any one of above (6) to (8), wherein the discharge confining means is electrically conductive.

(10) The apparatus according to above (9), wherein the high-frequency power introduced into the film-forming chamber has a frequency of not less than 10 MHz nor more than 10 GHz.

BRIEF DESCRIPTION OF THE DRAWINGS

Like features in the respective figures are indicated with like numerals.

DESCRIPTION OF THE PREFERRED EMBODIMENTS

Figure 1:
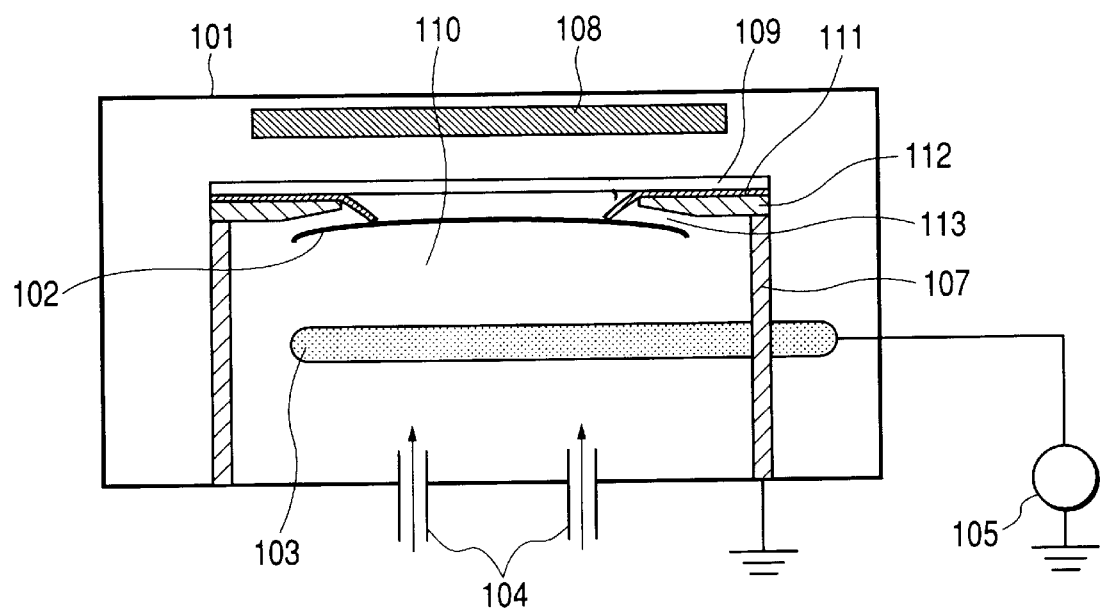
FIG. 1 is a sectional view taken along the width direction of a belt-like member of an i-layer reaction vessel in Example 1 of the present invention.

The present invention has realized the decrease in discharge leakage and sparks and the establishment of a stable discharge by the above-stated configurations, and it was based on the following expertise acquired as a result of elaborate research to achieve the object of the present invention by the inventors. In the operation of forming a deposited film on a belt-like member by the conventional roll to roll system, it is important to prevent the leakage of a discharge and active species from an activation region where a source gas is excited and decomposed, or reacts or where a source material is evaporated, in order to keep the discharge from leaking.

In this respect, the inventors conducted further investigation and investigation on mass production, and found that the aforementioned structure had another problem. Namely, there were cases where the discharge distribution became nonuniform, depending upon substrates, though the film formation was performed under the same conditions. Further, the discharge itself sometimes became unstable and even interruption of discharge occurred in the worst case. As a consequence, it was found that it could lead to nonuniform characteristics of the deposited film, degradation of the characteristics, and even peeling off thereof.

As a result of investigation on the causes, the inventors verified that fine undulation and evenness occurred at the width-direction edges of the belt-like member in the reaction vessel and the gaps of the discharge space caused thereby were responsible for the discharge leakage. In the operation of forming the semiconductor thin film with application of the bias in addition to the application of a high-frequency power, the causes of sparks were the change in the contact state of the belt-like member with the surrounding components due to the aforementioned fine undulation at the width-direction edges of the belt-like member and the vibration of the belt-like member itself.

Since the shape of the belt-like member will also always vary in the longitudinal direction thereof and since the mechanical property and shape of the belt-like member wound off from a substrate roll will vary from roll to roll when replacing the belt-like member, it was difficult to adapt the conventional surrounding components preliminarily to the variation of those.

The present invention has realized the decrease of discharge leakage and sparks and the establishment of a stable discharge by providing the discharge confining means on the back side opposite to the deposited film forming side of the belt-like member that forms one side of the film-forming chamber.

The discharge confining means in the present invention has the following features. Namely, the discharge confining means is disposed around the top plate, which is a component of the reaction vessel, and is constructed in such a structure that the discharge confining means itself undergoes deformation, displacement, rotation, or the like even under occurrence of deformation at the width-direction edges of the belt-like member to always maintain contact with the back surface opposite to the deposited film forming surface of the belt-like member while following the deformation or unevenness of the belt-like member, whereby the discharge confining means can hermetically close the gap (or clearance) between the belt-like member and the top plate so as to confine the discharge. Therefore, the discharge confining means can prevent production of a gap enough to cause a discharge leakage between the belt-like member and the reaction vessel and can also prevent appearance of sparks due to the change in the contact state of the belt-like member with the surrounding components.

The discharge confining means is made of a material capable of maintaining stable contact with the substrate during the conveyance of the belt-like substrate; preferably, having flexibility enough to always maintain contact with and press against the belt-like member even when the belt-like member is deformed, and enough abrasion resistance; more preferably, having such a hardness as to make no deep scratch on the belt-like member. The discharge confining means can be a member that is either electrically conductive or insulative, but it can desirably be kept at the earth potential together with the belt-like member in contact therewith; therefore, the discharge confining means is preferably made of a single metal such as Cu, Au, Al, Ni, Fe, or the like, an alloy such as stainless steel or the like, an electroconductive rubber, or the like. The discharge confining means is preferably of a store curtain shape, saw-tooth shape, spring shape, brush shape, slit shape, or the like, and needs to have a thickness enough to secure elasticity. Besides, the discharge confining means may be of a block shape, roller shape, a hinge shape, or the like. The mechanism by which the discharge confining means is maintained in contact with the belt-like member is not limited to those using elasticity, pressure (or pressing force), etc. described above, but can be any mechanism including, e.g., those using gravity such as dead weight, magnetism, and their combinations.

Further, concerning the clearance (or gap) between the belt-like member and the top plate, it does not necessarily have to be closed perfectly, but the aforementioned effects of the present invention can be enjoyed as long as the discharge can be confined efficiently. The source gas for the deposited film can be, for example, an amorphous silicon forming source gas such as silane ($SiH_4$), disilane ($Si_2H_6$), or the like; another functional-deposited-film forming source gas such as germane ($GeH_4$) or the like; or mixed gases thereof. A diluent gas can be selected from hydrogen ($H_2$), argon (Ar), helium (He), and so on. The effects of the present invention can also be similarly enjoyed when a dopant gas such as diborane ($B_2H_6$), boron fluoride ($BF_3$), phosphine ($PH_3$), or the like for the purpose of doping is simultaneously introduced into the discharge space (film-forming chamber).

In the present invention, the material for the belt-like member is normally selected, for example, from metals such as stainless steel, Al, Cr, Mo, Au, In, Nb, Te, V, Ti, Pt, Pd, Fe, and so on, their alloys, synthetic resins such as polycarbonate or the like, glass, ceramics, paper, and so on with the surface treated by an electrical conducting treatment. The belt-like member is preferably not less than 10 mm wide in the width direction and, particularly, most preferably not less than 20 mm nor more than 500 mm. There are no specific restrictions on the length of the belt-like member. While the belt-like member is continuously conveyed in the longitudinal direction, deposited films are formed thereon. The temperature of the substrate during the formation of deposited films in the present invention can be any temperature. Particularly, the substrate temperature is preferably not less than 20° C. nor more than 500° C. and more preferably not less than 50° C. nor more than 450° C. for better effects.

A conceivable power introducing method in the present invention includes introduction of high-frequency waves having a frequency of not less than 10 MHz nor more than 10 GHz. In general, the higher the frequency, the more likely the discharge leakage and the discharge interruption becomes to occur. A method of guiding the high-frequency waves to the reaction vessel can be selected, for example, from methods using a coaxial cable or a waveguide, and others. The high-frequency waves can be introduced into the film-forming chamber by one selected from methods of placing an antenna, a flat plate electrode, or a ceramic inlet port in the chamber according to the frequency of the high-frequency waves used, and others.

EXAMPLES

Examples of the present invention will be described below, but it is noted that the present invention is by no means intended to be limited to the examples.

Example 1

FIG. 1 is a sectional view taken along the transverse (or width) direction of the belt-like member of an i-layer reaction vessel in accordance with Example 1 of the present invention. In FIG. 1, the belt-like member 102 is set so that it can be conveyed in the direction perpendicular to the drawing in the film-forming chamber formed inside the reaction vessel 101.

The discharge confining means 111 with elasticity is kept in contact with a back surface of the belt-like member (i.e., substrate) which is opposite to the deposited film forming surface so as to maintain a press against the belt-like member. One end of the discharge confining means with elasticity is interposed between a top plate 109 and a top plate support 112 and the other end is kept in contact with the belt-like member so as to be maintained at the earth potential together with the belt-like member. The discharge confining means 111 possesses abrasion resistance and flexibility enough to always maintain contact with and a press against the back surface even when the belt-like member is deformed while following the deformation and unevenness thereof, and is shaped so as to always close the clearance 113 between the belt-like member and the top plate support 112 to such a degree as to prevent a leakage of the discharge.

Figure 6A:
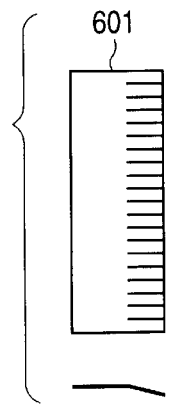
FIGS. 6A, 6B, 6C, 6D, 6E and 6F are views showing examples of the discharge confining means used in Examples of the present invention, wherein the upper is a plan view and the lower is a side view when viewed from the bottom of the drawing.

In the present example, oxygen-free copper (0.1 mm in thickness) is used as a material for the discharge confining means and the shape thereof is the so-called store curtain shape 601 as shown in FIG. 6A. This shape may be formed by, e.g., partly cutting a rectangular plate widthwise and parallel to each other at a plurality of locations and bending the cut portion at an angle along the longitudinal axis of the plate to provide the cut portion with elasticity. The manner of provision of the discharge confining means 601 is such that the non-cut-end in the width direction (i.e., the not cut longer side end) of the discharge confining means 601 is interposed between the top plate 109 and the top plate support 112 and the other end (i.e., cut end) with elasticity is kept in contact with the belt-like member. The belt-like member is conveyed parallel to the longitudinal axis of the discharge confining means 601. The top plate is heated by heater 108 and the substrate is also heated up to a predetermined temperature. A source gas is introduced through source gas feed pipes 104 from the bottom of the reaction vessel 101 into the interior of the film-forming chamber 110. The source gas is exhausted in the direction perpendicular to the drawing by an evacuation pump (not shown). A high-frequency power is supplied from a high-frequency power supply 105 via a high-frequency electrode 103 into the interior of the film-forming chamber 110 to decompose and excite the source gas to generate a plasma. In the present example, the discharge confining means is kept in contact with the back surface opposite to the film forming surface of the belt-like member, whereby the clearance 113 between the belt-like member and the top plate support 112 is closed well; therefore, the discharge can be maintained stable with less discharge leakage and spark and it becomes feasible to perform film formation over long periods of time or to convey the belt-like member at higher speeds, which achieves the effect of enhancing the productivity of the apparatus.

Figure 2:
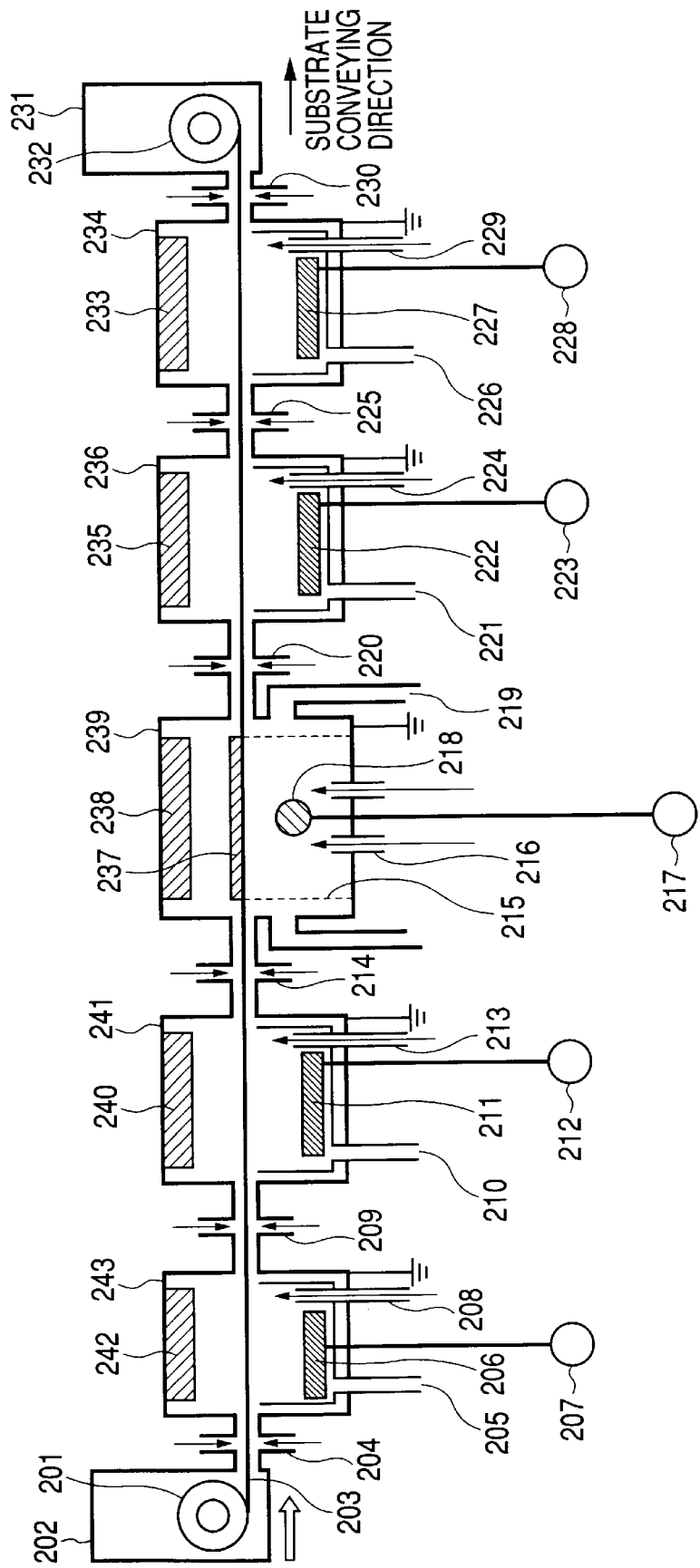
FIG. 2 is a sectional view showing an example of the deposited film forming apparatus of the roll to roll system used in Example 1 of the present invention.

FIG. 2 shows an example of the deposited film forming apparatus by the roll to roll system used in the present example.

A feeding vacuum vessel 202, an n-layer reaction vessel 243, an n/i buffer layer (i-type layer) reaction vessel 241, an i-layer reaction vessel 239 equipped with the discharge confining means of the present invention (not shown), a p/i buffer layer (i-type layer) reaction vessel 236, a p-layer reaction vessel 234, and a winding vacuum vessel 231 are connected through gas gates 204, 209, 214, 220, 225, and 230 and evacuated to vacuum through exhaust pipes 205, 210, 219, 221, 226 by an evacuation pump (not shown). The belt-like member 203 is wound on a feeding bobbin 201 and is conveyed through the n-layer reaction vessel 243, n/i buffer layer (i-type layer) reaction vessel 241, i-layer reaction vessel 239, p/i buffer layer (i-type layer) reaction vessel 236, and p-layer reaction vessel 234. After being subjected to the film formation and other necessary processes in the respective vacuum vessels, the belt-like member 203 is wound up onto a winding bobbin 232. A gate gas is allowed to flow through the gas gates 204, 209, 214, 220, 225, and 230 to prevent mixing of source gases between the vacuum vessels.

Figure 5:
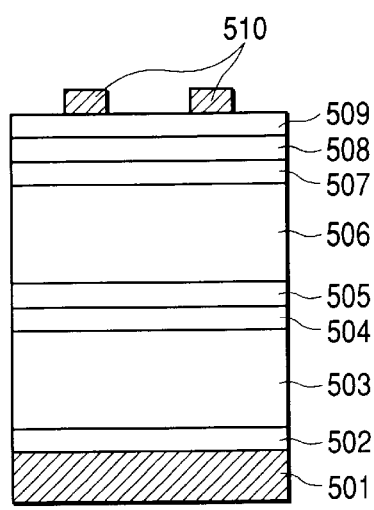
FIG. 5 is a schematic view showing a configuration of a p, p/i, i, n/i, and n-type photovoltaic element made by the deposited film forming apparatus in Example 1 of the present invention.

As the belt-like member 203 passes through the upper part of each film-forming chamber, it is heated to a desired temperature by the heater in each reaction vessel. In the n-layer reaction vessel 243, the high-frequency power is introduced from the high-frequency power supply 207 via the high-frequency electrode 206 into the interior of the film-forming chamber to decompose and excite the source gas to generate a plasma. An n-type amorphous silicon film is formed in this chamber. An i-type amorphous silicon film is formed similarly in each of the n/i buffer layer (i-type layer) reaction vessel 241, the i-layer reaction vessel 239, and the p/i buffer layer (i-type layer) reaction vessel 236. A p-type amorphous silicon film is formed similarly in the p-layer reaction vessel 234. FIG. 5 shows a configuration of a photovoltaic element consisting of five layers of p, p/i, i, n/i, and n structure produced using the apparatus shown in FIG. 2. First, a silver film 502 of 750 nm thick and a zinc oxide film 503 of 2,000 nm thick were deposited in the mentioned order, as a back reflecting layer on a stainless steel substrate 501. After that, an n-type amorphous silicon film 504 of about 30 nm thick, an i-type amorphous silicon film 505 of about 10 nm thick as an n/i buffer layer (i-type layer), an a-SiGe film 506 of about 100 nm thick as the aforementioned i-type layer, an i-type amorphous silicon film 507 of about 6 nm thick as a p/i buffer layer (i-type layer), and a p-type amorphous silicon film 508 of about 10 nm thick were deposited in the mentioned order. The conditions for the formation of the respective films are presented in Table 1. The conveying speed of the belt-like member was 600 mm/min and continuous film formation was performed on the belt-like member 203 of 100 meters long in all the examples and comparative examples.

TABLE 1

| Formed layer | Flow rates of source gases ($cm^3$/min at standard conditions) | | Pressure (Pa) | High-frequency power (W) | Substrate temperature (° C.) |
|---|---|---|---|---|---|
| n-type layer | $SiH_4$<br>$H_2$<br>$PH_3/H_2(PH_3:2\%)$ | 90<br>900<br>70 | 130 | 90<br>(13.56 MHz) | 300 |

TABLE 1-continued

| Formed layer | Flow rates of source gases ($cm^3$/min at standard conditions) | | Pressure (Pa) | High-frequency power (W) | Substrate temperature (° C.) |
|---|---|---|---|---|---|
| n/i buffer layer (i-type layer) | $SiH_4$<br>$H_2$ | 20<br>500 | 150 | 25<br>(13.56 MHz) | 280 |
| i-type layer | $SiH_4$<br>$GeH_4$<br>$H_2$ | 75<br>75<br>300 | 3.5 | 1,000<br>(100 MHz) | 320 |
| p/i buffer layer (i-type layer) | $SiH_4$<br>$H_2$ | 10<br>500 | 150 | 200<br>(13.56 MHz) | 220 |
| p-type layer | $SiH_4$<br>$H_2$<br>$BF_3/H_2(BF_3:2\%)$ | 5<br>2,000<br>150 | 130 | 200<br>(13.56 MHz) | 250 |

Subsequently, an indium tin oxide film 509 was deposited as a surface electrode also functioning as an antireflection coating in a thickness of 70 nm, and finally a Cr film of 200 nm thick, an Ag film of 800 nm thick, and a Cr film of 20 nm thick were deposited in the mentioned order, as a collecting electrode 510.

Comparative Example 1

Figure 3:
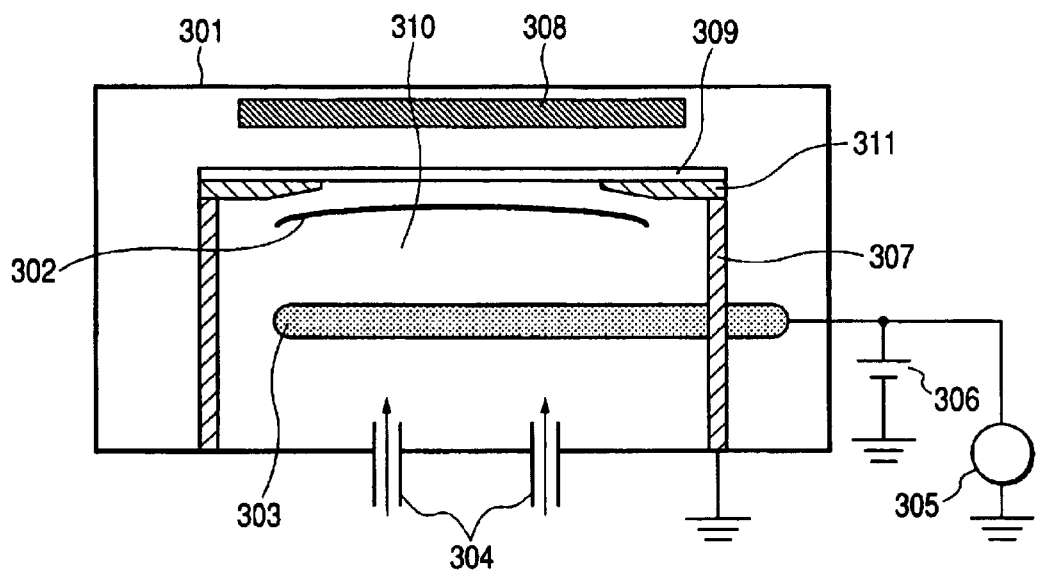
FIG. 3 is a sectional view taken along the width direction of a belt-like member of the i-layer reaction vessel in a conventional example.

A photovoltaic element consisting of the five layers of p, p/i, i, n/i, and n structure shown in FIG. 5 was formed on the substrate 302 following the procedure similar to that in Example 1 and under the conditions of Table 1, using the production apparatus of FIG. 2 equipped with the conventional i-layer reaction vessel shown in FIG. 3, which had the same structure as the i-layer reaction vessel of FIG. 1 except that the discharge confining means was removed from the i-layer reaction vessel. Accordingly, items 301–305 and 307–310 in FIG. 3 correspond to items 101–105 and 107–110 in FIG. 1. Item 311 corresponds to item 112. DC power supply 306 corresponds to DC power supply 406 in FIG. 4. Comparison was made for the number of discharge interruptions during the film formation of the i-type layer on the basis of the result of measurement for the photovoltaic element in Comparative Example 1 as a reference of 1.00. As presented in the comparison table of Table 2, the photovoltaic element of Example 1 was greatly improved (i.e., decreased) in the number of discharge interruptions occurring during the film formation of the i-layer, as compared with the photovoltaic element of Comparative Example 1. It thus turned out that the functional deposited film forming method and forming apparatus of the present invention had excellent discharge stability, thus verifying the effects of the present invention.

TABLE 2

| | Number of discharge interruptions |
|---|---|
| Example 1 | 0.4 |
| Comparative Example 1 | 1.00 |

Examples 2-1, 2-2 and 2-3

Figure 4:
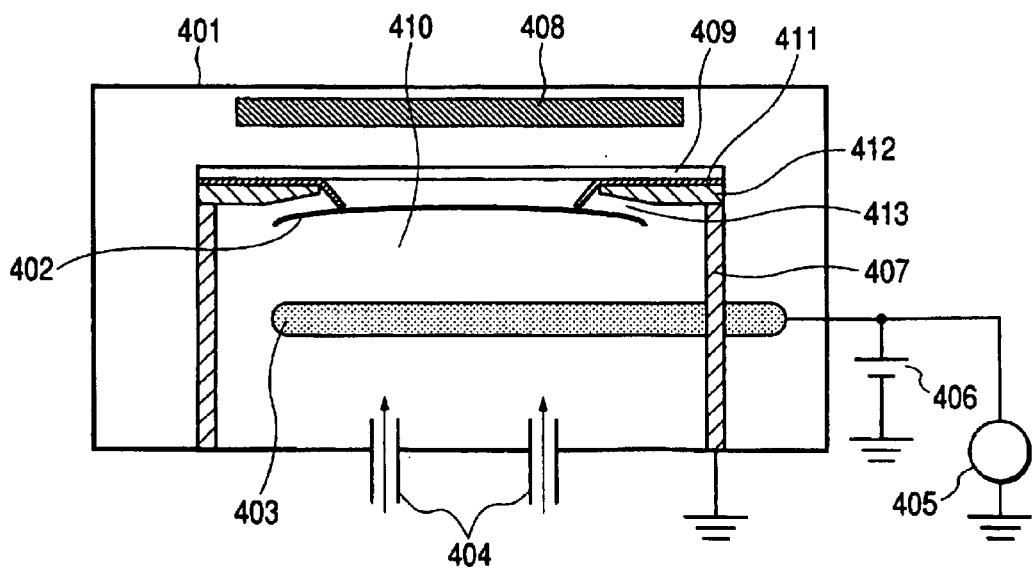
FIG. 4 is a sectional view taken along the width direction of a belt-like member of the i-layer reaction vessel in Example 2 of the present invention.

In Example 2-1, a photovoltaic element consisting of the five layers of p, p/i, i, n/i, and n structure shown in FIG. 5 was produced following the procedure similar to that in Example 1 and under the conditions of Table 1, using the production apparatus of FIG. 2 the i-layer reaction vessel of which was replaced by the i-layer reaction vessel shown in FIG. 4. The i-layer reaction vessel of FIG. 4 is different from that of FIG. 1 in that a DC bias voltage is applied from a DC power supply 406 to the high-frequency electrode in the i-layer film-forming chamber. The conditions were substantially the same as in Example 1 except that a DC voltage of +300 V was additional applied. Accordingly, items 401–405 in FIG. 4 correspond to items 101–105 in FIG. 1 and items 407–413 correspond to items 107–113.

Figure 6B:
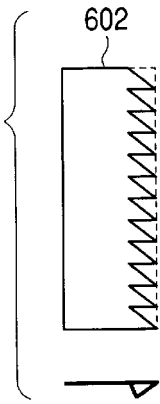

In Example 2-2, a deposited film was formed using the i-layer reaction vessel in which the discharge confining means was of the saw-tooth shape 602 shown in FIG. 6B. This shape may be formed by, e.g., partly cutting a rectangular plate widthwise and parallel to each other at a plurality of locations and bending each cut portion approximately at a right angle in a triangle shape on the same surface side of the plate.

Figure 6C:
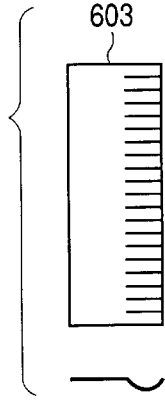

In Example 2-3, a deposited film was formed using an i-layer reaction vessel equipped with the discharge confining means of the spring shape 603 shown in FIG. 6C. This shape may be formed by, e.g., partly cutting a rectangular plate widthwise and parallel to each other at a plurality of locations and curving each cut rectangular portion to provide spring-like elasticity.

Comparative Example 2

A photovoltaic element consisting of the five layers of p, p/i, i, n/i, and n structure shown in FIG. 5 was produced following the same procedure as in Examples 2-1, 2-2, and 2-3 and under the conditions of Table 1 except that the discharge confining means was removed from the i-layer reaction vessel. Just as in Example 1 and Comparative Example 1, comparison was made as to the number of discharge interruptions and the number of sparks occurring during the film formation of the i-type layer in Examples 2-1, 2-2, and 2-3 on the basis of those in Comparative Example 2 as a reference of 1.00. As presented in a comparison table of Table 3, the photovoltaic elements in Example 2-1, Example 2-2, and Example 2-3 were greatly improved (i.e., decreased) in the number of discharge interruptions and the number of sparks occurring in the film formation of the i-layer, as compared with the photovoltaic element in Comparative Example 2. It was shown that the functional-deposited-film forming method and forming apparatus of the present invention had excellent discharge stability, thus verifying the effects of the present invention.

TABLE 3

|  | Number of discharge interruptions | Number of spark occurrences |
| --- | --- | --- |
| Example 2-1 | 0.25 | 0.04 |
| Example 2-2 | 0.19 | 0.02 |
| Example 2-3 | 0.35 | 0.05 |
| Comparative Example 2 | 1.00 | 1.00 |

Example 3

Figure 6D:
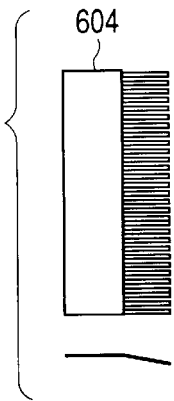
Figure 6E:
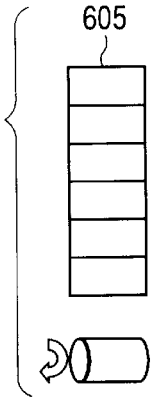
Figure 6F:
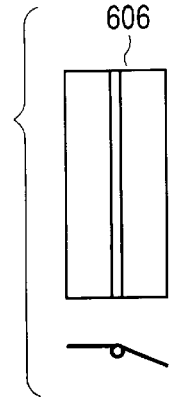

In Example 3, photovoltaic elements were produced in much the same manner as in Examples 2-1 to 2-3 except that the discharge confining means of the i-layer reaction vessel was of the brush shape 604, the roller shape 605, and the hinge shape 606 shown in FIGS. 6D, 6E, or 6F, respectively.

The shape of FIG. 6D may be formed by, e.g., partly cutting a rectangular plate widthwise and parallel to each other at a large number of locations to provide a brush-like shape and bending the brush-like cut portion at an angle along the longitudinal axis of the plate. The shape of FIG. 6E may be formed by, e.g., arranging a plurality of rollers parallel to each other in a freely rotatable fashion. The shape of FIG. 6F may be formed by, e.g., coupling two rectangular plates with each other via a hinge in such a fashion that when one plate is held horizontally, the other plate will hang down by its dead weight. As a consequence, the photovoltaic elements were greatly improved (i.e., decreased) in the number of discharge interruptions and the number of sparks occurring in the film formation of the i-layer, thus achieving the effects similar to those in Examples 2-1 to 2-3.

As described above, according to the present invention, by providing the discharge confining means on the back surface side opposite to the deposited film forming surface side of the belt-like member that constitutes one side of the film-forming chamber, it is possible to achieve the decrease of discharge leakage and sparks and the establishment of stable discharge and to enhance the element characteristics and the productivity of the apparatus, particularly, when forming and producing the photovoltaic element as functional deposited films on the long belt-like member.

What is claimed is:

1. A deposited film forming method of, while continuously conveying a belt-like member in a longitudinal direction thereof, passing the belt-like member through a film-forming chamber, one side of which is formed of the belt-like member and which is located in a vacuum-sealable reaction vessel, introducing a reactive gas into the film-forming chamber, evacuating the interior of the film-forming chamber by evacuation means to maintain the interior of the film-forming chamber at a given pressure, introducing a high-frequency power into the film-forming chamber to induce a plasma, and forming a deposited film on the belt-like member passing through the film-forming chamber,
wherein on a side opposite to a deposited film forming side of the belt-like member that forms said one side of the film-forming chamber, there is provided discharge confining means always maintaining contact with said opposite side of the belt-like member while following a change in shape of the belt-like member to hermetically close gaps between the opposite side of the belt-like member and the discharge confining means, whereby the deposited film is formed in a state of reduced discharge leakage and sparks in the film-forming chamber.

2. The method according to claim 1, wherein the discharge confining means is comprised of a shaped member always maintaining contact with said opposite side of the belt-like member by at least one of elasticity, pressure, gravity, and magnetism.

3. The method according to claim 2, wherein the shaped member is of a store curtain shape, saw-tooth shape, spring shape, brush shape, roller shape, or hinge shape.

4. The method according to any one of claims 1 to 3, wherein the discharge confining means is electrically conductive.

5. The method according to claim 4, wherein the high-frequency power introduced into the film-forming chamber has a frequency of not less than 10 MHz nor more than 10 GHz.

6. A deposited film forming apparatus comprising: means for continuously conveying a substrate consisting of a belt-like member for formation of a deposited film, in a longitudinal direction thereof; a vacuum-sealable reaction vessel having therein a film-forming chamber, one side of which is constituted of the belt-like member; means for introducing a reactive gas into the film-forming chamber; means for introducing a high-frequency power from a high frequency power supply into the film-forming chamber; and means for evacuating the interior of the film-forming chamber, > wherein on a side opposite to a deposited film-forming side of the belt-like member that forms said one side of the film-forming chamber, there is provided discharge confining means always maintaining contact with said opposite side of the belt-like member while following a change in shape of the belt-like member to hermetically close gaps between the opposite side of the belt-like member and the discharge confining means.

7. The apparatus according to claim 6, wherein the discharge confining means is comprised of a shaped member always maintaining contact with said opposite side of the belt-like member by at least one elasticity, pressure, gravity, and magnetism.

8. The apparatus according to claim 7, wherein the shaped member is of a store curtain shape, saw-tooth shape, spring shape, brush shape, roller shape, or hinge shape.

9. The apparatus according to any one of claims 6 to 8, wherein the discharge confining means is electrically conductive.

10. The apparatus according to claim 9, wherein the high-frequency power introduced into the film-forming chamber has a frequency of not less than 10 MHz nor more than 10 GHz.

* * * * *